United States Patent [19]
Kovacs

[11] Patent Number: 4,782,242
[45] Date of Patent: Nov. 1, 1988

[54] CIRCUIT ARRANGEMENT FOR GENERATING HIGH VOLTAGE PULSES

[76] Inventor: Adam Kovacs, Buza u 2, H-2097 Pilisborosjeno, Hungary

[21] Appl. No.: 2,619
[22] PCT Filed: Sep. 6, 1985
[86] PCT No.: PCT/HU85/00053
§ 371 Date: Jan. 29, 1987
§ 102(e) Date: Jan. 29, 1987
[87] PCT Pub. No.: WO86/06226
PCT Pub. Date: Oct. 23, 1986

[30] Foreign Application Priority Data
Apr. 11, 1985 [HU] Hungary ............... 1335/85

[51] Int. Cl.⁴ .................................. F23Q 3/00
[52] U.S. Cl. .......................... 307/106; 307/107; 307/108; 315/209 SC; 315/209 CD; 123/651; 123/620
[58] Field of Search ............. 307/106–110; 123/596, 597, 600, 601, 602, 604, 605, 606, 620, 621, 653, 654, 655, 656, 648 L, 641–643; 315/209 R, 209 CD, 209 M, 209 SC, 214, 223, 225, 226

[56] References Cited

U.S. PATENT DOCUMENTS

| | | | |
|---|---|---|---|
| 3,331,120 | 7/1967 | Tomlin | 307/106 |
| 3,736,464 | 5/1973 | Lohberg et al. | 315/209 CD X |
| 3,824,429 | 7/1974 | Davalillo | 315/209 CD X |
| 3,877,864 | 4/1975 | Carlson | 307/106 X |
| 3,980,922 | 9/1976 | Katsumata et al. | 315/209 CD |
| 4,176,644 | 12/1979 | Hellberg et al. | 123/651 X |
| 4,244,337 | 1/1981 | Asai | 315/209 SC X |
| 4,293,797 | 10/1981 | Gerry | 123/620 X |

Primary Examiner—William M. Shoop, Jr.
Assistant Examiner—Paul Ip
Attorney, Agent, or Firm—James F. Haley, Jr.; A. Peter Adler

[57] ABSTRACT

A circuit arrangement for generating high voltage pluses from the circuit includes a transformer comprising at least two primary windings and secondary windings, in which the primary windings are connected with at least one diode, a switching circuit and a voltage source. A first capacitor is connected in parallel with the first primary winding and diode, and in series with the secondary primary winding. The switching circuit is formed from the emitter-collector-section of a switching transistor. The output of a transistor amplifier is connected to the base of the switching transistor. The input of the transistor amplifier is coupled with the output of a control circuit. Two serial connected resistors are inserted between the input of the transistor amplifier and the output of the control circuit. The emitter-collector-section of a first transistor is connected to the common terminal of both the resistors. A voltage divider is connected to the base of the first transistor. The leg of the voltage divider on the collector side of the first transistor includes two serial connected resistors. A second capacitor is connected between (a) the point between the two serial connected resistors in the leg of the voltage divider on the collector side of the first transistor, and (b) the common terminal of the primary winding of the transformer and of the switching transistor. A current sensing resistor is connected in series with the emitter-collector-circuit of the switching transistor.

6 Claims, 3 Drawing Sheets

CIRCUIT ARRANGEMENT FOR GENERATING HIGH VOLTAGE PULSES

TECHNICAL FIELD

The invention relates to a circuit arrangement for generating high voltage pulses from DC voltage comprising a transformer, a secondary winding and at least two primary windings of said transformer, said primary windings, at least one diode and a switching circuit are serial connected; said series circuit is connected to a voltage source, a capacitor is connected to the common terminal of said voltage source and of said primary windings, further said switching circuit is formed from the emitter-collector-section of a switching transistor, on the base of said switching transistor the output of a transistor amplifier is connected and the input of said transistor amplifier is coupled with the output of a control circuit.

The generating of pulses, especially of high voltage pulses is frequently needed in the electrotechnics and electronics. This demand occurs very often in the field of the vehicle electrics, where the high voltage sparks for the ignition of internal combustion motors are generated by high voltage pulses. Such high voltage pulses are used to the ignition of flash tubes too, which are applied not only in the phototechnics, but also in traffic control systems and many other technical fields. We described the invention in relation with ignition systems of internal combustion motors, nevertheless the invention is not limited to this technical field.

BACKGROUND ART

Electronic ignition systems of internal combustion motors are commonly used, which systems may be divided into two groups. In the first group there are the so-called thyristor or capacitive ignition systems; in such a system a capacitor will be charged and the stored energy of this capacitor will be switched on the primary winding of the high voltage transformer by means of a thyristor at the instant of the ignition. The advantage of such systems is that the contact breaker, which controls the instant of the ignition, switches very small current only, therefore the lifetime of the contact breaker increases. The drawback of such systems is however that an inverter is needed to charge the capacitor, which owing to its structure needs many components, is expensive, and during the short time between two pulses only a limited amount of energy can be stored in the capacitor at acceptable cost.

To the second group of electronic ignition systems belong the so-called transistor ignition systems; in such a system not a contact breaker, but a switching transistor circuit is serial connected to the primary winding of a conventional ignition coil. In such a system the contact breaker is disburdened too, since it generates a control pulse of very small current only and a switching transistor is used to interrupt the high current of the primary winding. The advantages of such a system is the disburdening of the contact breaker, and that higher current pulses can be interrupted in the primary winding of the ignition coil.

It is well known that the quality of the combustion in an internal combustion motor as well as the efficiency of the motor can be improved in that way that the ignition of the fuel will be effected more perfectly, and this is possible by increasing the energy of the ignition spark.

As we mentioned, in capacitive ignition systems the increasing of the energy of the spark is limited by the complexity and costs of the system. The energy converting efficiency of transistor ignition systems is relatively low. The energy of the high voltage pulse as well as that of the spark changes significantly with the change of the supply voltage, and this hampers especially the cold starting of internal combustion motors of vehicles. As it is well known, at cold starting the starting electric motor reduces the voltage of the cold start battery to such an extent that this reduced battery voltage is frequently not enough to generate the ignition spark.

It is the aim of the Hungarian Pat. No. 186,116. "Circuit arrangement for generating high voltage pulses" to eliminate these drawbacks, in which the primary winding of the high voltage transformer is divided into two winding parts. In this known circuit one of the primary windings of the transformer as well as a switching circuit and a capacitor form together a loop circuit. Both primary windings are serial connected and over a diode they are connected to a voltage source. The operation principle of this circuit is that at the instant of switching on the switching transistor forming a switching circuit the stored energy of the capacitor drives current through one of the primary windings of the transformer, which current adds itself to the current flowing from the voltage source and by this way a significantly higher current pulse can be generated through the primary winding.

It is the advantage of this circuit that at the interrupting of the current flowing through the primary winding, that is when the switching transistor switches off, the voltage arising in the other primary winding with opposite polarity and charges the capacitor. In this way this is an energy recovery circuit, since the induced voltage arising at the interruption of the current charges over the energy stored in the transformer into the capacitor. In this way this is an energy recovery circuit. Although this circuit worked well in the practice, the winding used to energy recovery does not work at generating the spark.

In the circuit arrangements described above theoretically electromechanical switching devices could also be used as switching circuits, yet these have so many drawbacks that in electronic ignition systems they are used at most as control switches. To interrupt the high current flowing through the primary winding of the transformer high power switching transistors come above all into consideration. I have used such a transistor in the ignition system according to my above mentioned Hungarian Pat. No. 186,116. In this known circuit the switching transistor is actuated by a transistor amplifier, which is controlled by a control circuit. A negative feedback circuit is applied comprising a voltage dependent resistor so that lest the changing, first of all the reduction of the supply voltage may significantly reduce the energy of the pulse. This voltage dependent resistor - taking into consideration the low supply voltage, the needed characteristic and the value of the resistor - should be an incandescent lamp, yet the dimensions, lifetime and reliability of which are disadvantageous compared to other components, and this is why the practical applicability of this circuit arrangement is limited.

The invention has for its object to provide a circuit arrangement described in the opening paragraph, which should combine the advantages of both the capacitive and the transistor ignition systems; moreover the stored magnetic energy should be recoverable with the best possible efficiency and by this way the efficiency of the generating the high voltage pulse should be improved. Another aim of the invention was to form such a switching circuit, by means of which the energy of the high voltage impulse could be kept constant under a supply voltage changing within broad limits, what would be very advantageous especially to cold starting of internal combustion motors of vehicles.

DISCLOSURE OF THE INVENTION

I achieved this object by means of the circuit arrangement of the kind mentioned in the opening paragraph in that the input of a transistor amplifier is the base of a second transistor, between said input and the output of a control circuit two serial connected resistors are inserted, to the common terminal of both said resistors the emitter--collector-section of a first transistor is connected, to the base of the first transistor a voltage divider is connected, the branch of which standing on the collector side is divided and connected to a voltage source between the dividing point of said branch and the common terminal of a primary winding of a transformer and of a switching transistor a capacitor is inserted, a resistor of said voltage divider inserted on the emitter side is connected to a current control resistor which is in series with the emitter-collector-circuit of said switching transistor.

The advantage of this circuit arrangement is that by means of the applied double feedback very steep switching of the switching transistor can be achieved and in the same time the energy of the generated pulse keeps practically constant even by a reduction of the voltage of the voltage source by over 50%.

In the circuit arrangement according to the invention in a control circuit a series circuit comprising a pair of actuating contacts, a resistor and an induction coil is connected to said voltage source, the base-emitter-section of a transistor is connected parallel to said induction coil having such a polarity that the voltage arising in said induction coil at the interruption of the current switches on said transistor, and the output of said control circuit is formed by the collector of said transistor. The advantage of this circuit arrangement is that the structure of it is much more simple than that of the above mentioned Hungarian Pat. No. 186,116; in the same time the voltage pulse generated by the interruption of the current of the induction coil gives rise to a fast and definite switching.

It is further advantageous that between the base of said transistor and said induction coil a voltage divider is inserted. Expediently between the collector of said transistor forming the output of said control circuit and said current control resistor a capacitor is inserted.

An advantageous embodiment of the invention aims to accelerate the switching, in which a capacitor is connected parallel to said resistor, which is serial connected to the input of said transistor amplifier.

A further circuit arrangement according to the invention is also advantageous to achieve the set aim, which comprises a transformer, a secondary winding and at least two primary windings of said transformer, said primary windings as well as at least one diode and a switching circuit are serial connected, said series circuit is connected to a voltage source, a capacitor is connected to the common terminal of said voltage source and of said primary windings, and which according to the invention is characterized in that said diode is inserted between both said primary windings, said capacitor is parallel connected to said first primary winding attaching itself directly to said voltage source as well as to said diode connected serial to said first primary winding, and a further capacitor is parallel connected to said second primary winding, as well as to said diode is connected serial to said second primary winding, and said diode is inserted in forward direction in respect of the polarity of the voltage source. This last circuit arrangement has the advantage that at generating the pulse a significant part of the energy supplied into the transformer can be recovered by the way that the magnetic energy stored in the iron core at the instant of the interrupting the current is charged over into the capacitor and stored in it, and afterwards this stored energy will be utilized to the energy of the following pulse.

BRIEF DESCRIPTION OF THE DRAWINGS

FIG. 2 is the equivalent circuit diagram of the circuit diagram of FIG. 1 at the instant of the switching on;

BEST MODE OF CARRYING OUT THE INVENTION

Figure 1:
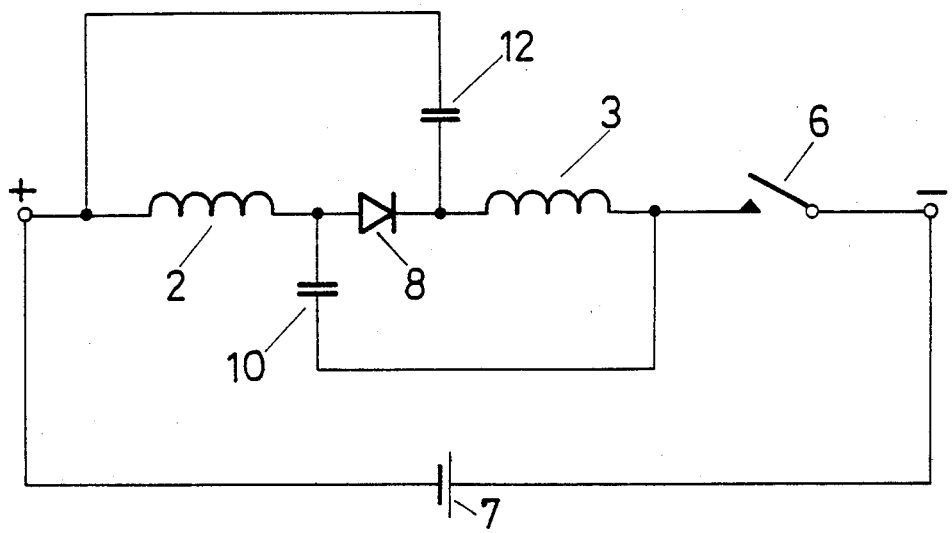
FIG. 1 is a circuit diagram of an energy recovery circuit of the transformer according to the invention.

In FIG. 1 the primary windings 2 and 3 of the transformer 1 of the circuit according to the invention can be seen only, between which a diode 8 is inserted. The diode 8 is inserted in forward direction in respect of the polarity of the voltage source 7. Capacitors 12 and 10 are through the diode 8 parallel connected to the primary windings 2 and 3 respectively. The terminals of the capacitor 12 are connected to the positive pole of the voltage source 7 and to the cathode of the diode 8 respectively. The terminals of the capacitor 10 are connected to the anode of the diode 8 and to the terminal of the primary winding 3 standing toward the negative pole of the voltage source 7 respectively. The switching circuit 6 is inserted between the primary winding 3 and the negative pole of the voltage source 7.

The function of the circuit shown in FIG. 1 is as follows.

At switching on the switching circuit 6 current begins to flow from the positive pole through the primary windings 2, the diode 8, the primary winding 3 and the switching circuit 6 into the negative pole of the voltage source 7. Meanwhile magnetic energy is accumulated in the primary windings 2 and 3. At switching off the switching circuit 6 the current is interrupted through the primary windings 2 and 3 and a voltage jump of opposite polarity to the former voltage arises on the terminals of the primary windings 2 and 3. Accordingly the terminal of the primary winding 2 connected to the diode 8 will be of positive polarity, and the terminal of the primary winding 3 connected to the cathode of the diode 8 will be of negative polarity. At this instant the primary windings 2 and 3 can be considered as voltage sources and with the said polarities the diode 8 is in conducting state. Thus the stored magnetic energy of the primary winding 2 flows through the diode 8 into the capacitor 12 and will be converted into electrostatic energy stored in the capacitor 12. Similarly the voltage jump arising in the primary winding 3 charges the capacitor 10 through the diode 8. When the magnetic energy of the primary windings 2 and 3 has been fully overcharged into the capacitors 12 and 10 respectively, the voltage on the terminals of the primary windings 2 and 3 ceases and the diode 8 switches off. The circuit rests in this condition.

At the instant of switching on again the voltages of the capacitors 12 and 10 will add themselves to the voltage of the voltage source 7 and—since the diode 8 is still in off state—the capacitor 12 will be discharged through the primary winding 3 and the capacitor 10 through the primary winding 2 respectively. Taking into consideration that the capacitors 12 and 10 can be charged up to a higher voltage, a high current pulse arises through the primary windings 2 and 3. When the charge of the capacitors has been used up, that is their voltages have decreased, the diode 8 renders conducting and a current of the same direction flows through the primary windings 2 and 3 and the diode 8 between them from the voltage source 7. Under the influence of the high current pulse flowing through the primary windings 2 and 3 a high voltage pulse arises in the secondary winding of the high voltage transformer not shown here. Of course the voltage source has to be suitable to lead through the high current pulse at the instant of the discharge of the capacitors 10 and 12. This is easily possible in the case of having a starter battery.

After the capacitors 12 and 10 have transmitted their energy to the primary windings 3 and 2 respectively in form of said current pulses, they lose their charges, their voltages cease and afterwards the current flowing from the voltage source 7 through the primary windings 2 and 3 accumulates magnetic energy again in the iron core of the high voltage transformer 1. Thereafter under the influence of the repeated switching off and on of the switching circuit 6 the process mentioned above occures repeatedly and accordingly high voltage pulses arise.

Figure 2:
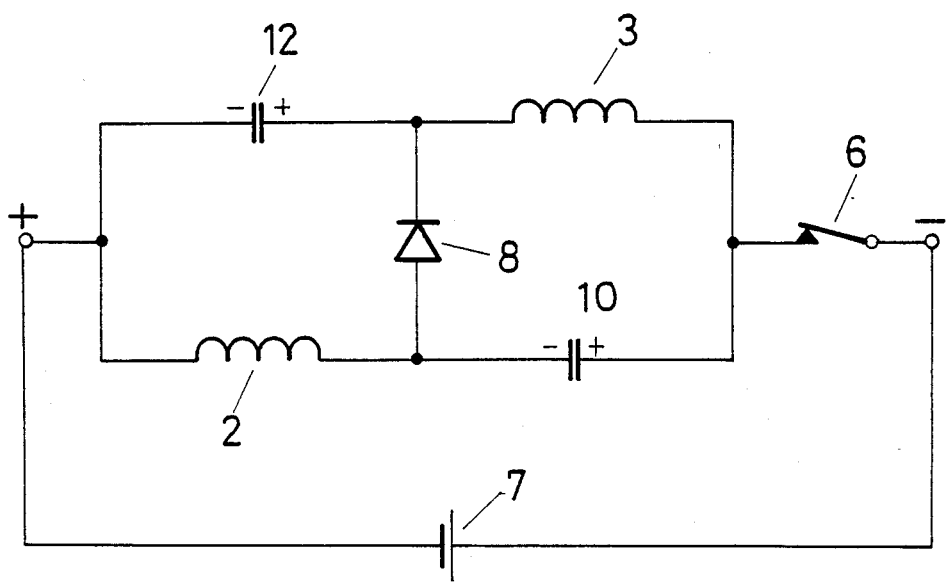
Figure 3:
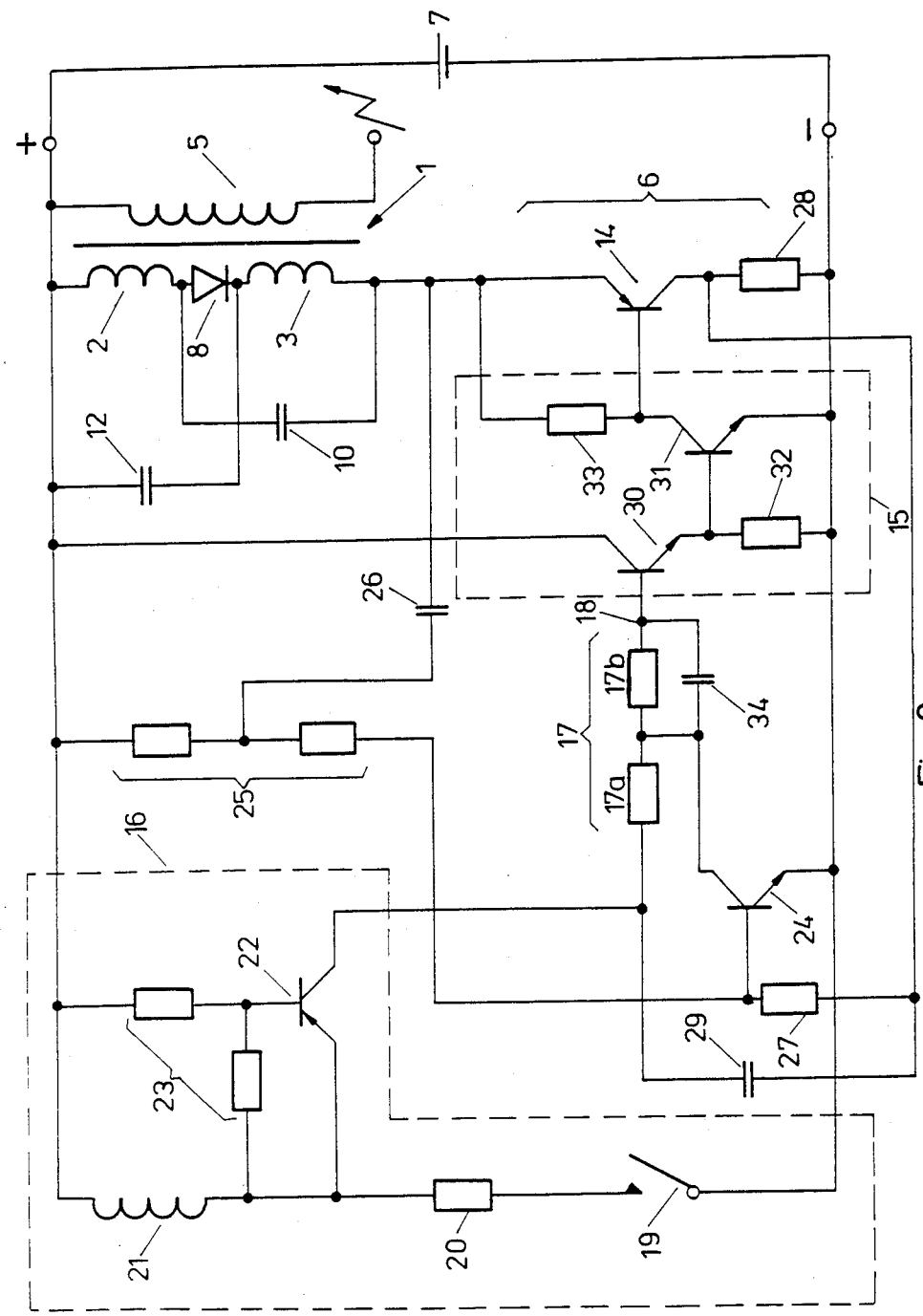
FIG. 3 is an embodiment of the switching circuit according to the invention.

In FIG. 3 the practically realized switching circuit according to the invention is shown with the above mentioned circuit arrangement also according to the invention. In this circuit arrangement the transformer 1 comprises two primary windings 2 and 3, between them a diode 8 is inserted with a polarity that in respect of the polarity of the voltage source 7 the diode 8 is in forward direction. To the common terminals between the diode 8 and the primary winding 2 or rather the primary winding 3 capacitors are connected in such a way that capacitor 10 is connected to the anode of the diode 8, the other terminal of which is connected to the terminal of the primary winding 3 standing toward the negative pole of the voltage source 7. To the cathode of the diode 8 capacitor 12 is connected, the other terminal of which attaches itself to the terminal of the primary winding 2 standing toward the positive pole of the voltage source 7. The transformer 1 comprises a secondary winding 5 in which under the influence of the current pulse described in connection with FIG. 1 and FIG. 2 respectively high voltage pulse arises.

In the switching circuit according to the invention shown in FIG. 3 the switching circuit 6 is formed by a switching transistor 14. The switching transistor 14 is controlled by a control circuit 16 over an inserted transistor amplifier 15. In the transistor amplifier 15 transistors 30 and 31 form together a two stage d.c. amplifier. In the example shown here the transistor 30 is an npn transistor in common collector circuit and a resistor 32 is inserted in its emitter circuit. To the emitter of the transistor 30 the base of a transistor 31 is connected, which is in common emitter circuit. The transistor 31 has a load resistance 33 in its collector circuit, the other terminal of which is connected to the emitter of the switching transistor 14; which is in this example in common collector circuit and is formed by a pnp transistor. The input 18 of the transistor amplifier 15 is the base of the transistor 30. A resistor 17 is serial connected to the input 18, which in an advantageous embodiment is divided into two parts, which are formed from the resistors 17a and 17b.

The output of a control circuit 16 is connected to the input 18 of the transistor amplifier 15 over the resistors 17a and 17b. In the control circuit 16 a pair of actuating contacts 19, a resistor 20 and an induction coil 21 are connected in series to the voltage source 7. In applications to internal combustion motors the pair of actuating contacts 19 is formed by the contact breaker of the motor. The base-emitter-circuit of a transistor 22 is parallel connected to the induction coil 21. It may be practical to insert a voltage divider 23 into the base circuit, which divides the voltage going to the base.

The function of the switching circuit 16 is—partly on the basis of the waveform shown in FIG. 4—as follows.

At closing the pair of actuating contacts 19 a current begins to flow through the resistor 20 and the induction coil 21, and then the current flowing through the induction coil 21 will be interrupted and a voltage will be induced in it, the polarity of which is such that a positive voltage jump will get to the emitter of the transistor 22 and a negative voltage jump to the base of the same. It is to be noted that in the example shown here the transistor 22 is of pnp type. Under the influence of the voltage jump of the induction coil 21 the transistor 22 switches on and from the voltage source 7 through the induction coil 21 and the emitter-collector-circuit of the transistor 22 a forward voltage gets to the input 18 of the transistor amplifier 15. To the output of the transistor amplifier 15 a capacitor 29 is connected—this we shall mention later again—, which is important in respect of the forming of the waveform on the input 18. When under the influence of the voltage pulse appearing on the induction coil 21 the transistor 22 switches on, then the current flowing through its emitter-collector-circuit is driven not only by the voltage of the voltage source 7, but also by the voltage pulse connected serial to the former arising in the induction coil 21.

To the dividing point of the above mentioned divided resistor 17 between the resistors 17a and 17b—which is principally the divided input point of the input 18—the emitter-collector-circuit of a first transistor 24 is parallel connected. By this way the input 18 of the transistor amplifier 15 as well as the switching transistor 14 is in off condition, when the first transistor 24 is in conducting condition. Between the collector of the switching transistor 14 and the negative pole of the voltage source 7—the latter is generally an earthed pole—a current control resistor 28 of very low value is inserted. The value of this current control resistor 28 is a few mOhms only, therefore practically it does not limit the current flowing through the switching transistor 14 as well as the primary windings 2 and 3 of the transformer 1. To the base of the above mentioned first transistor 24 a voltage divider is connected, the resistor 27 of which laying on the emitter side connected to the current control resistor 28. The resistor 25 of the same voltage divider being on the collector side is connected to the positive pole of the voltage source 7 and is divided suitably in two resistors. Between the dividing point of these two resistors and the common terminal of the switching transistor 14 and of the transformer 1 a capacitor 26 is inserted. This capacitor 26 produces a voltage feedback to the base of the first transistor 24 and in the same time the voltage arising on the current control resistor 28—which voltage is proportional to the current—produces a current feedback to the base of the same first transistor 24.

Figure 4:
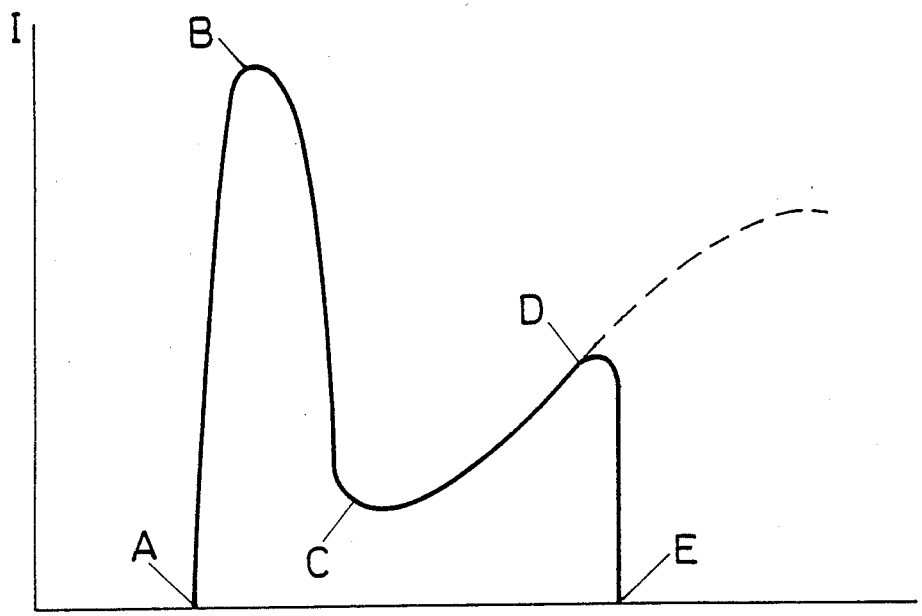
FIG. 4 is the waveform of the current flowing through the switching circuit according to the invention.

The function of the circuit arrangement of FIG. 3 can be followed up on basis of FIG. 4 too.

FIG. 4 shows the waveform of the current I flowing through the primary windings 2 and 3 of the transformer 1, the switching transistor 14 and the current control resistor 28 as the function of time t. At point A the switching transistor 14 switches on and, as it has been described, the capacitors 10 and 12 connected serial to the voltage source 7 give rise to a high current pulse, which increases up to the point B. At point B the charge of the capacitors 10 and 12 has been used up and the current I decreases up to the point C. This current pulse induces a high voltage pulse in the secondary winding of the transformer 1.

On the current control resistor 28 a voltage arises, which is proportional to the current I. This voltage adds itself to the voltage stored in the capacitor 29 and this results in that the transistor 30 as well as the switching transistor 14 rests in on state further on, when the transistor 22 has been switched off.

This voltage arising on the current control resistor 28 controls the base of the first transistor 24 too and in the vicinity of point B it makes an effort to switch on the first transistor 24. Nevertheless the much higher negative pulse arising on the capacitor 26 in the same time counteracts it and keeps the transistor 24 in the vicinity of point B still safely in off state, therefore the switching off of the switching transistor 14 safely does not take place. With the knowledge of the voltage divider of the transistor 24, of the capacitor 26, of the voltage of the voltage source 7 and of the voltage drop arising on the current control resistor 28 this function can easily be calculated.

In FIG. 4 after point B the discharge current of the capacitors 10 and 12 decreases and at point C the current of the voltage source 7 only flows through the primary windings 2 and 3 and the diode 8, which meanwhile has been rendered conducting. From point C on the current I begins to increase with a slope defined by the inductivity of the transformer 1. Reaching point D the voltage arising on the current control resistor 28 switches on the additional transistor 24 over the resistor 27. It is to be noted that the pulse of switching off polarity on the capacitor 26 is now no more present. At the instant of the switching on of the transistor 24 the switching transistor 14 switches off abruptly and the interrupted current I induces a voltage of opposite polarity in the primary windings 2 and 3, which charges up the capacitors 10 and 12 again.

The temperature dependence of the transistor 24 is such that the temperature dependent change of the forward voltage changes the position of the point D on the diagram I. At lower temperature the point D moves into the direction of the dash line in FIG. 4, i.e. the current I can increase to a higher value. This again gives rise to the increase of the magnetic energy stored in the transformer 1, i.e. the high voltage pulse is practically of constant energy between broad limits in cold, at lower supply voltage too. This is highly advantageous at the cold starting of vehicles.

It may be advantageous to connect a capacitor 34 parallel to the resistor 17b, which speeds up the switching on the second transistor 30.

Figure 5:
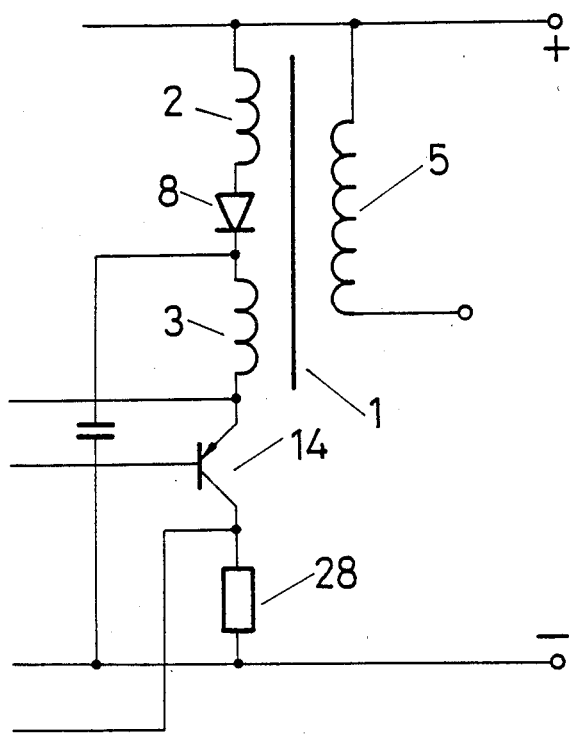
FIG. 5 shows the application of the switching circuit according to the invention in the energy recovery circuit of the above mentioned Hungarian patent HU-PS T/31.483.

The switching circuit according to the invention and shown in FIG. 3 is applicable to other pulse generating circuit too, the transformer 1 of which is completed with an energy recovery circuit. An example of such a circuit arrangement is shown in FIG. 5.

The primary windings 2 and 3 of the transformer 1 as well as the diode 8 are inserted serial into the emitter-collector-circuit of the switching transistor 14. Up to this point the switching arrangement corresponds to that shown in FIG. 3. The difference is that the primary winding 3, the switching transistor 14 and a capacitor 34 together form a loop circuit, as it is described in details in the above mentioned patent specification HU-PS T/31.483. The function of the switching circuit according to the invention is the same in this case too as described above.

The above described circuit arrangement according to the invention has been accomodated in the casing of a conventional ignition transformer. As the control circuit 16, the transistor amplifier 15 and in some cases the switching transistor 14 are suitable to be integrated together or developed as a hybrid circuit, so they can be easily accomodated in the casing of a conventional ignition transformer together with the high voltage transformer 1. By this way the complete circuit arrangement according to the invention can be directly exchanged for a conventional ignition coil used in vehicles today, no additional device, equipment or casing is needed. This improves significantly the applicability of the circuit arrangement according to the invention.

I claim:

1. Circuit arrangement for generating high voltage pulses from DC voltage comprising:
    a transformer including a secondary winding and at least a first primary winding and a second primary winding;
    a rectifying means connected between said first primary winding and said second primary winding;
    a first capacitor connected in parallel with said first primary winding and said rectifying means and in series with said second primary winding;
    switching means, comprising the emitter-collector section of a switching transistor connected in series with a current sensing means, connected in series with said rectifying means and said first and second primary windings to form a first series circuit;
    means for connecting said first series circuit to a voltage source;
    a control means;
    an amplifying means;
    first connecting means for connecting an output of said control means to an input of said amplifying means;

second connecting means for connecting an output of said amplifying means to the base of said switching transistor;

said first connecting means further comprising first and second resistors connected in series, the common terminal of said first and second resistors being connected through the emitter-collector section of a first transistor to a first terminal of said voltage source connecting means, and a voltage divider connected to the base of said first transistor, wherein said voltage divider comprises a first leg including a third resistor and a second leg including a fourth resistor and a fifth resistor connected in series, said first leg connected to a terminal between said switching transistor and said current sensing means, said second leg connected to a second terminal of said voltage connecting means, and a terminal between said fourth and fifth resistors connected through a second capacitor to a terminal between said switching transistor and said primary windings.

2. The circuit of claim 1, wherein said control means comprises:

a pair of actuating contacts, a sixth resistor, and an inductor, all connected in series between said first and second terminals of said voltage source connecting means; and a second transistor;

wherein said inductor is connected between the base and the emitter of said transistor, the polarity of said second transistor is selected such that it turns on in response to the voltage induced in the inductor when the actuating contacts are opened, and the collector of said second transistor connected to the output of the control means.

3. The circuit of claim 2, wherein said control means further includes a voltage divider between the base of said second transistor and said inductor.

4. The circuit of claim 1, wherein the output of the control means is also connected through a third capacitor to said terminal between said switching transistor and said current sensing means.

5. The circuit of claim 1, further comprising a capacitor connected between the input to said amplifying means and said common terminal between said first and second resistors.

6. Circuit arrangements for generating high voltage pulses from DC voltage comprising:

a transformer including a secondary winding and at least a first primary winding and a second primary winding;

a rectifying means connected in series between said first primary winding and said second primary winding;

a first capacitor connected in parallel with said first primary winding and said rectifying means and in series with said second primary winding;

a second capacitor connected in parallel with said second primary winding and said rectifying means and in series with said first primary winding; and switching means connected in series with said rectifying means and said first and second primary windings to form a series circuit;

means for connecting said series circuit to a voltage source.

* * * * *